Figure 1:
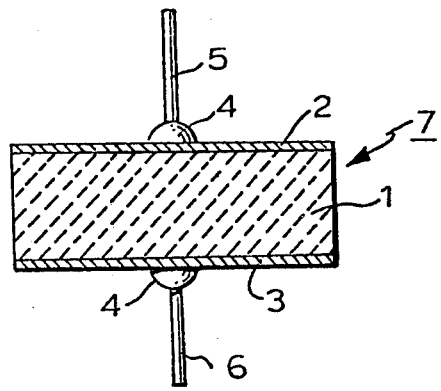

United States Patent

Ouchi et al.

[11] 4,210,546
[45] Jul. 1, 1980

[54] PIEZOELECTRIC CERAMIC COMPOSITIONS

[75] Inventors: Hiromu Ouchi, Toyonaka; Masamitsu Nishida, Osaka; Shigeru Hayakawa, Hirakata, all of Japan

[73] Assignee: Matsushita Electric Industrial Co., Ltd., Osaka, Japan

[21] Appl. No.: 619,005

[22] Filed: Oct. 2, 1975

[30] Foreign Application Priority Data

Oct. 9, 1974 [JP] Japan .................................. 49-116474
Oct. 9, 1974 [JP] Japan .................................. 49-116475
Oct. 9, 1974 [JP] Japan .................................. 49-116476
Oct. 9, 1974 [JP] Japan .................................. 49-116477
Oct. 9, 1974 [JP] Japan .................................. 49-116478

[51] Int. Cl.² ........................ C04B 35/46; C04B 35/48
[52] U.S. Cl. ........................................................ 252/62.9
[58] Field of Search ........................ 252/62.9 D, 62.9 T

[56] References Cited

U.S. PATENT DOCUMENTS

| 3,268,453 | 8/1966 | Ouchi et al. | 252/62.9 |
| 3,518,199 | 6/1970 | Tsubouchi et al. | 252/62.9 |
| 3,528,918 | 9/1970 | Nishida et al. | 252/62.9 |
| 3,595,795 | 7/1971 | Tsubouchi et al. | 252/62.9 |
| 3,661,781 | 5/1972 | Ichinose et al. | 252/62.9 |
| 3,669,887 | 6/1972 | Nishida et al. | 252/62.9 |

FOREIGN PATENT DOCUMENTS

1580831 9/1969 France ...................... 252/62.9

*Primary Examiner*—Jack Cooper
*Attorney, Agent, or Firm*—Wenderoth, Lind & Ponack

[57] ABSTRACT

Piezoelectric ceramic compositions having low dissipation factor, high mechanical quality factor, certain specified electromechanical coupling coefficients and high time stability of resonant resistance, and comprising the ternary system $Pb(Sn_{\frac{1}{3}}Sb_{\frac{2}{3}})O_3$-$PbTiO_3$-$PbZrO_3$ and containing at least one oxide selected from the group consisting of $MnO_2$, $CoO$, $Cr_2O_3$, $Fe_2O_3$ and $NiO$ in a total quantity equivalent to from 0.1 to 5 weight percent.

4 Claims, 2 Drawing Figures

PIEZOELECTRIC CERAMIC COMPOSITIONS

This invention relates to piezoelectric ceramic compositions and articles of manufacture fabricated therefrom. More particularly, this invention pertains to novel and improved ferroelectric ceramics which are polycrystalline aggregates of certain constituents. These piezoelectric compositions are sintered into ceramics by ordinary ceramic techniques and thereafter the ceramics are polarized by applying a D.C. voltage between electrodes to impart thereto electromechanical transducing properties similar to the well known piezoelectric effect. This invention also encompasses the calcined intermediate products of raw ingredients and the articles of manufacture such as electromechanical transducers fabricated from the sintered ceramic.

The use of piezoelectric materials in various transducer applications in, for example, the production, measurement and sensing of sound, shock, vibration, pressure, and high voltage generation, have increased greatly in recent years. Both crystal and ceramic types of transducers have been widely used, but because of their potentially lower cost and ease of use in the fabrication of ceramics of various shapes and sizes and their greater durability at high temperature and/or high humidities than crystalline substances such as Rochelle salt, piezoelectric ceramic materials have recently come into prominent use in various transducer applications.

The piezoelectric characteristics required for ceramics apparently vary depending upon the intended application. For example, electromechanical transducers such as phonograph pick-ups and microphone elements require piezoelectric ceramics characterized by a substantially high electromechanical coupling coefficient and dielectric constant. On the other hand, in filter and resonator applications of piezoelectric ceramic compositions, it is desirable that the materials exhibit a lower dissipation factor, a higher value of mechanical quality factor, a certain specified electromechanical coupling coefficient, a low resonant resistance and high time stability of resonant resistance.

The above subject mater is described in detail in, for example, R. C. V. Macario, "Design Data for BandPass Ladder Filters Employing Ceramic Resonators," Electronic Engineering, Vol. 33, No. 3, p.p. 171–177, (1961).

In filter application, it is desirable and essential that the electromechanical coupling factor have a specified optimum value, and that the factor vary over a wide range from an extremely high to a very low value. This is fully described in the paper of Macario referred to above. The mechanical quality factor is reciprocally related to the energy consumed by the material during the energy conversion, and, the larger the mechanical quality factor, the smaller is the energy consumed.

The transducer element of piezoelectric transformer provides still other important fields of application of piezoelectric ceramics. In this case, both the electromechanical coupling factor and the mechanical quality factor should be as large as possible.

It is well known that conventional piezoelectric ceramics, for example, barium titanate and lead titanate-zirconate exhibit a small electromechanical coupling factor and are not generally satisfactory for practical use. Moreover, the dielectric and piezoelectric properties of the lead titanate-zirconate ceramics vary greatly depending upon the firing technique employed due to the evaporation of PbO. Improvement of these factors has been made by incorporating various additional constituents into the basic ceramic composition or by incorporating various complex compounds. For example, U.S. Pat. No. 2,911,370 teaches lead titanate-zirconate ceramics modified with $Nb_2O_5$, $Ta_2O_5$, $La_2O_3$ etc., and U.S. Pat. No. 3,403,103 teaches ternary system $Pb(Zn_{\frac{1}{3}}Nb_{\frac{2}{3}})O_3$-$PbTiO_3$-$PbZrO_3$ ceramics. These ceramics exhibit a high electromechanical coupling coefficient, but exhibit a low mechanical quality factor and a low time stability of resonant resistance.

It is, therefore, a fundamental object of this invention to provide novel and improved piezoelectric ceramic materials which overcome the problems outlined above.

A specific object of this invention is the provision of improved polycrystalline ceramics characterized by low dissipation factor, high mechanical quality factors and certain specified planar coupling coefficients i.e. from a high value to a low value along with high time stability of resonant resistance.

Figure 2:
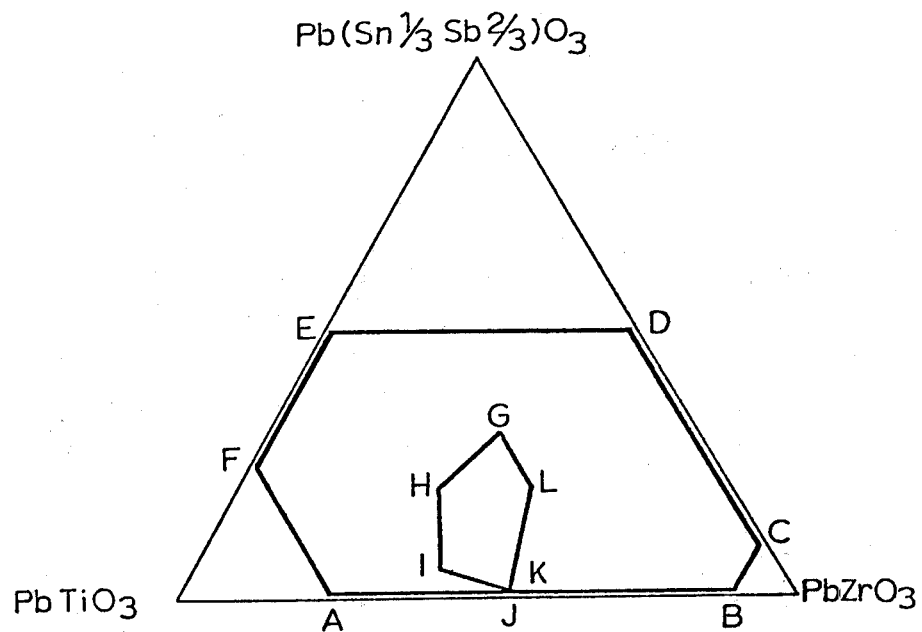

These objects of this invention and the manner of their attainment will be readily apparent from the following description and the accompanying drawings, in which:

FIG. 1 is a cross-sectional view of an electromechanical transducer embodying this invention; and FIG. 2 is a triangular compositional diagram of materials according to this invention.

Before describing in detail the piezoelectric materials contemplated by this invention, their application in electromechanical transducers will be described with reference to FIG. 1 wherein reference character 7 designates, as a whole, an electromechanical transducer having, as its active element, a body preferably disc shaped, of a piezoelectric ceramic material according to this invention. The body 1 is electrostatically polarized, in a manner hereinafter set forth, and is provided with a pair of electrodes 2 and 3 which are applied to two opposed surfaces thereof in a suitable and per se conventional manner. Wire leads 5 and 6 are attached conductively to the electrodes 2 and 3, respectively, by means of solder 4. When the ceramic is subjected to shock, vibration and/or other mechanical stress, the electrical output generated can be taken out from the wire leads 5 and 6. Conversely, as with other piezoelectric transducers, application of electrical voltage to electrodes 5 and 6 will result in mechanical deformation of the ceramic body. It is to be understood that the term electromechanical transducer as used herein is taken in its broadest sense and includes piezoelectric filters, frequency control devices, and the like, and that this invention can also be used for and adapted to various other applications requiring materials having piezoelectric, dielectric and/or electrostrictive properties.

According to this invention, the ceramic body 1, FIG. 1, is formed of a novel piezoelectric composition, which is a polycrystalline ceramic composed of:

$Pb(Sn_{\frac{1}{3}}Sb_{\frac{2}{3}})O_3$-$PbTiO_3$-$PbZrO_3$ modified with at least one oxide selected from the group consisting of $MnO_2$, $CoO$, $Cr_2O_3$, $Fe_2O_3$ and $NiO$.

This invention is based on the discovery that within certain particular compositional ranges of this system, the specimens exhibit low dissipation factor, high mechanical quality factors and certain specified electromechanical coupling coefficients along with high time stability of resonant resistance.

The ceramic compositions of this invention have various advantages in the processes for their manufacture and in their application for ceramic transducers. It has been known that the evaporation of PbO during firing is a problem encountered in the sintering of lead compounds such as lead titanate-zironate. The compositions of this invention evidence a smaller amount of evaporated PbO than the usual lead titanate-zirconate upon firing. The ternary system can be fired in the absence of a PbO atmosphere. A well sintered body according to this composition is obtained by firing the above described compositions in a ceramic crucible covered with a ceramic cover made of $Al_2O_3$ ceramics. A high sintered density is desirable for resistance to humidity and high piezoelectric response when the sintered body is utilized as a resonator and for other applications.

All possible compositions fall within the ternary system $Pb(Sn_{\frac{1}{3}}Sb_{\frac{2}{3}})O_3$-$PbTiO_3$-$PbZrO_3$ are represented by the triangular diagram of FIG. 2. Some compositions represented by the diagram, however, do not exhibit high piezoelectricity. Many are electromechanically active only to a slight degree and show low mechanical quality factor. This invention is concerned with those compositions exhibiting piezoelectric responses of appreciable magnitude. For convenience sake, the planar coupling coefficient (kp) of test discs will be taken as a measure of piezoelectric activity. Thus, within the area bounded by lines connecting points A, B, C, D, E and F in FIG. 2, all compositions polarized and tested showed a planar coupling coefficient of approximately 0.09 or higher. The compositions in the area of the diagram bounded by lines connecting points G, H, I, J, K and L in FIG. 2 exhibit a planar coupling coefficient of approximately 0.4 or higher. The molar ratio of the three composition components of A, B, C, D, E, F, G, H, I, J, K and L are as follows:

|   | $Pb(Sn_{1/3}Sb_{2/3})O_3$ | $PbTiO_3$ | $PbZrO_3$ |
|---|---|---|---|
| A | 0.01 | 0.75 | 0.24 |
| B | 0.01 | 0.09 | 0.90 |
| C | 0.09 | 0.01 | 0.90 |
| D | 0.50 | 0.01 | 0.49 |
| E | 0.50 | 0.495 | 0.005 |
| F | 0.25 | 0.745 | 0.005 |
| G | 0.30 | 0.33 | 0.37 |
| H | 0.20 | 0.48 | 0.32 |
| I | 0.05 | 0.55 | 0.40 |
| J | 0.01 | 0.47 | 0.52 |
| K | 0.05 | 0.43 | 0.52 |
| L | 0.20 | 0.33 | 0.47 |

According to this invention, piezoelectric and dielectric properties of the ceramics can be adjusted to suit various applications by selecting the proper basic compositions of the above description and additive of at least one oxide selected from the group consisting of $MnO_2$, CoO, $Cr_2O_3$, $Fe_2O_3$ and NiO in the range from 0.1 to 5 weight percent.

The compositions described herein may be prepared in accordance with various well-known ceramic procedures. A preferred method, however, hereinafter more fully described, contemplates the use of PbO or $Pb_3O_4$, $SnO_2$ or SnO, $Sb_2O_3$, $TiO_2$, $ZrO_2$, $MnO_2$, CoO, $Cr_2O_3$, $Fe_2O_3$ and NiO as starting materials.

EXAMPLE

The starting material, viz., lead oxide (PbO), stannic oxide ($SnO_2$), antimony trioxide ($Sb_2O_3$), titania ($TiO_2$), zirconia ($ZrO_2$) and one oxide selected from the group consisting of manganese dioxide ($MnO_2$), cobalt oxide (CoO), chromium oxide ($Cr_2O_3$), iron oxide ($Fe_2O_3$) and nickel oxide (NiO), all of relatively pure grade (e.g.c.p. grade) were intimately mixed in a rubber-lined ball mill with distilled water. In milling the mixture, care was exercised to avoid contamination due to wear of the milling ball or stones and this was avoided by varying the proportions of the starting materials to compensate for any contamination.

Following the wet milling, the mixture was dried and mixed to ensure as homogeneous a mixture as possible. Thereafter, the mixture was suitably formed into desired forms at a pressure of 400 kg/cm². The compacts were then pre-reacted by a calcination at a temperature of about 850° C. for about 2 hours. After this calcination, the reacted material was allowed to cool and was then wet milled to a small particle size. One additive selected from the group consisting of $MnO_2$, CoO, $Cr_2O_3$, $Fe_2O_3$ and NiO may be added to the reacted material after calcination of raw materials which did not include the additive. Once again, care was exercised to avoid contamination by wear of the milling balls or stones. Depending on preference and the shapes desired, the material may be formed into a mix or slip suitable for pressing, slip casting or extruding, as the case may be, in accordance with conventional ceramic forming procedures. The mix was then pressed into discs of 20 mm diameter and 2 mm thickness at a pressure of 700 kg/cm². The pressed discs were fired at 1220° to 1310° C. for 1 hour. There was no need to fire the composition in an atmosphere of PbO, and moreover, there was no need to maintain a special temperature gradient in the firing furnace as is necessary in the procedures used to form known piezoelectric compositions. Uniform and excellent ceramic products were easily obtained simply by covering the samples with an alumina crucible during firing.

The sintered ceramics were polished on both surfaces to a thickness of 1 millimeter. The polished disc surfaces were then coated with silver paint and fired to form silver electrodes. Finally, the discs were polarized while immersed in a bath of silicone oil at 100° C. A voltage gradient of D.C. 4 kV per mm was maintained for one hour, and each of the discs was field-cooled to room temperature in thirty minutes.

After the ceramic discs had been allowed to stand for 24 hours, the electromechanical coupling factor for the radial mode vibration (kp) and the mechanical quality factor ($Q_M$) were measured to evaluate the piezoelectric activities. The measurement of these piezoelectric properties was made according to the IRE standard circuit. The value of kp was calculated by the resonant to antiresonant frequency method. The dielectric constant and dissipation factor (D) were also measured at a frequency of 1 kHz, 20° C. in a relative humidity of 50%. The aging rate of resonant resistance with time (R-t) was obtained by percent change in resonant resistance between 24 and 5000 hours on the basis of the value at 24 hours after poling.

That is $(R - t) = \dfrac{(R - t)_{at\ 5000\ hr} - (R - t)_{at\ 24\ hr}}{(R - t)_{at\ 24\ hr}}$ Examples of specific ceramic compositions according to this invention and various properties thereof are given in Tables 1 to 5.

From Tables 1-5, it will be evident that according to this invention, all exemplary compositions within a polygonal region A B C D E F in FIG. 2 modified with at least one oxide selected from the group consisting of $MnO_2$, CoO, $Cr_2O_3$, $Fe_2O_3$ and NiO are characterized by low dissipation factor, high mechanical quality factors and certain specified electromechanical coupling coefficients along with high time stability of resonant resistance, all of which properties are important for the use of piezoelectric compositions in ceramic filter, resonator and transformer applications. It is also evident from Tables 1–5 that the value of electromechanical coupling coefficient and mechanical quality factor can be adjusted to suit various applications by appropriately selecting the composition. For example, the ceramic compositions within a polygonal region G H I J K L in FIG. 2 modified with at least one of additive selected from the group consisting of $MnO_2$, CoO, $Cr_2O_3$, $Fe_2O_3$ and NiO are characterized by high mechanical quality factor and high electromechanical coupling coefficient along with high time stability of resonant resistance. Therefore, the piezoelectric ceramic compositions of this invention are suitable for the application of electromechanical transducer elements such as piezoelectric ceramic filters, resonators and transformers. And the compositions of this invention other than the above examplary compositions also exhibit excellent piezoelectric and mechanical properties. In ceramic compositions containing at least one additive selected from the group consisting of $MnO_2$, CoO, $Cr_2O_3$, $Fe_2O_3$ and NiO in an amount greater than 5 weight percent, the leakage current during poling increases with a decrease of the volume resistivity of ceramics, and a satisfactory remanent piezoelectricity is difficult to obtain. Ceramic compositions containing less than 0.1 weight percent of at least one additive oxide selected from the group consisting of $MnO_2$, CoO, $Cr_2O_3$, $Fe_2O_3$ and NiO exhibited no improvement in $Q_M$, D and R-t. For these reasons, the compositions outside these ranges are excluded from the scope of this invention.

In addition to the superior properties shown above, the compositions according to this invention yield ceramics of good physical quality and which can be polarized well. It will be understood from the foregoing that the ternary solid solution $Pb(Sn_{\frac{1}{3}}Sb_{\frac{2}{3}})O_3$-$PbTiO_3$-$PbZrO_3$ modified with the specified amounts of at least one additive selected from the group consisting of $MnO_2$, CoO, $Cr_2O_3$, $Fe_2O_3$ and NiO form excellent piezoelectric ceramics.

It will be evident that the starting materials to be used in this invention are not limited to those used in the above examples. Those oxides may be used, in place of the starting materials of the above examples, which are easily decomposed at elevated temperatures to form the required compositions.

While there have been described what at present are believed to be the preferred embodiments of this invention, it will be obvious that various changes and modifications can be made therein without departing from the spirit or scope of this invention.

Table 1

| Ex-ample No. | Base Material (Molar ratio) x | Y | z | Additive $MnO_2$ (wt %) | $D_{(\%)}$ | $Q_M$ | kp | R-t$_{(\%)}$ |
|---|---|---|---|---|---|---|---|---|
| 1* | 0.01 | 0.75 | 0.24 | 0 | 2.60 | 150 | 0.11 | 15.6 |
| 2 | " | " | " | 0.1 | 1.84 | 530 | 0.13 | 5.4 |
| 3 | " | " | " | 5 | 2.13 | 490 | 0.11 | 5.2 |
| 4* | 0.01 | 0.47 | 0.52 | 0 | 3.00 | 70 | 0.71 | 15.9 |
| 5 | " | " | " | 0.5 | 0.56 | 690 | 0.53 | 5.1 |

Table 1-continued

| Ex-ample No. | Base Material (Molar ratio) x | Y | z | Additive $MnO_2$ (wt %) | $D_{(\%)}$ | $Q_M$ | kp | R-t$_{(\%)}$ |
|---|---|---|---|---|---|---|---|---|
| 6 | " | " | " | 2 | 0.83 | 820 | 0.47 | 4.8 |
| 7* | 0.01 | 0.09 | 0.90 | 0 | 4.40 | 360 | 0.16 | 15.4 |
| 8 | " | " | " | 0.1 | 2.12 | 780 | 0.18 | 5.6 |
| 9 | " | " | " | 5 | 4.20 | 590 | 0.16 | 6.0 |
| 10* | 0.05 | 0.55 | 0.40 | 0 | 1.70 | 150 | 0.49 | 15.5 |
| 11 | " | " | " | 0.5 | 0.62 | 540 | 0.41 | 4.7 |
| 12* | 0.05 | 0.43 | 0.52 | 0 | 3.10 | 80 | 0.65 | 15.8 |
| 13 | " | " | " | 0.1 | 0.58 | 490 | 0.67 | 5.3 |
| 14 | " | " | " | 0.5 | 0.43 | 2090 | 0.51 | 4.5 |
| 15 | " | " | " | 3 | 0.55 | 2230 | 0.47 | 4.8 |
| 16 | " | " | " | 5 | 1.98 | 1340 | 0.45 | 5.9 |
| 17 | " | " | " | 6 | 3.42 | 450 | 0.36 | 16.5 |
| 18* | 0.10 | 0.75 | 0.15 | 0 | 2.20 | 200 | 0.11 | 15.2 |
| 19 | " | " | " | 0.5 | 0.54 | 1080 | 0.13 | 4.9 |
| 20* | 0.09 | 0.01 | 0.90 | 0 | 2.50 | 460 | 0.11 | 15.7 |
| 21 | " | " | " | 0.1 | 1.73 | 950 | 0.13 | 5.6 |
| 22 | " | " | " | 5 | 2.28 | 780 | 0.10 | 6.1 |
| 23* | 0.20 | 0.48 | 0.32 | 0 | 1.80 | 130 | 0.44 | 15.3 |
| 24 | " | " | " | 0.5 | 0.40 | 510 | 0.42 | 4.5 |
| 25* | 0.20 | 0.33 | 0.47 | 0 | 3.50 | 130 | 0.48 | 15.6 |
| 26 | " | " | " | 0.1 | 2.83 | 560 | 0.50 | 5.3 |
| 27 | " | " | " | 0.5 | 0.41 | 1820 | 0.43 | 4.4 |
| 28 | " | " | " | 5 | 3.20 | 1240 | 0.39 | 5.9 |
| 29* | 0.20 | 0.10 | 0.70 | 0 | 4.20 | 290 | 0.22 | 15.4 |
| 30 | " | " | " | 0.5 | 0.57 | 1030 | 0.19 | 5.0 |
| 31* | 0.25 | 0.745 | 0.005 | 0 | 2.90 | 190 | 0.10 | 14.8 |
| 32 | " | " | " | 0.1 | 0.51 | 640 | 0.12 | 5.7 |
| 33 | " | " | " | 5 | 2.32 | 510 | p.09 | 6.2 |
| 34* | 0.30 | 0.48 | 0.22 | 0 | 1.70 | 210 | 0.30 | 14.9 |
| 35 | " | " | " | 0.5 | 0.46 | 1530 | 0.28 | 4.6 |
| 36* | 0.30 | 0.33 | 0.37 | 0 | 3.40 | 170 | 0.40 | 15.5 |
| 37 | " | " | " | 1 | 0.51 | 1780 | 0.35 | 4.8 |
| 38 | " | " | " | 5 | 3.17 | 490 | 0.31 | 6.0 |
| 39* | 0.30 | 0.23 | 0.47 | 0 | 4.10 | 220 | 0.28 | 15.2 |
| 40 | " | " | " | 0.5 | 0.56 | 1150 | 0.27 | 4.7 |
| 41* | 0.30 | 0.01 | 0.69 | 0 | 5.50 | 160 | 0.12 | 15.1 |
| 42 | " | " | " | 0.5 | 0.87 | 850 | 0.13 | 4.9 |
| 43* | 0.50 | 0.495 | 0.005 | 0 | 5.00 | 110 | 0.11 | 15.6 |
| 44 | " | " | " | 0.1 | 3.23 | 500 | 0.13 | 5.8 |
| 45 | " | " | " | 5 | 3.94 | 520 | 0.10 | 6.1 |
| 46* | 0.50 | 0.23 | 0.27 | 0 | 4.20 | 70 | 0.20 | 15.2 |
| 47 | " | " | " | 0.5 | 0.59 | 980 | 0.18 | 4.8 |
| 48* | 0.50 | 0.01 | 0.49 | 0 | 5.00 | 150 | 0.11 | 15.9 |
| 49 | " | " | " | 0.1 | 3.41 | 540 | 0.13 | 5.7 |
| 50 | " | " | " | 5 | 4.08 | 490 | 0.09 | 6.2 |

Note:
D :Dissipation factor
$Q_M$ :Mechanical quality factor
kp :Electromechanical planar coupling coefficient
R-t :Percent change in resonant resistance with time
Specimens with a single asterisk (*) are outside the scope of this invention
These notations are applied to Tables 2,3,4 and 5 as well as to Table 1.

Table 2

| Ex-ample No. | Base Material (Molar ratio) x | y | z | Additive CoO (wt%) | $D_{(\%)}$ | $Q_M$ | kp | R-t$_{(\%)}$ |
|---|---|---|---|---|---|---|---|---|
| 51 | 0.01 | 0.75 | 0.24 | 0.1 | 2.07 | 520 | 0.14 | 5.0 |
| 52 | " | " | " | 5 | 2.38 | 500 | 0.11 | 4.8 |
| 53 | 0.01 | 0.47 | 0.5 | 0.5 | 0.68 | 610 | 0.60 | 4.8 |
| 54 | " | " | " | 2 | 0.99 | 780 | 0.52 | 4.5 |
| 55 | 0.01 | 0.09 | 0.90 | 0.1 | 2.53 | 620 | 0.19 | 5.2 |
| 56 | " | " | " | 5 | 4.28 | 560 | 0.17 | 5.5 |
| 57 | 0.05 | 0.55 | 0.40 | 0.5 | 0.73 | 520 | 0.48 | 4.3 |
| 58 | 0.05 | 0.43 | 0.52 | 0.1 | 0.69 | 480 | 0.67 | 4.9 |
| 59 | " | " | " | 0.5 | 0.51 | 1670 | 0.56 | 4.1 |
| 60 | " | " | " | 3 | 0.65 | 1830 | 0.50 | 4.3 |
| 61 | " | " | " | 5 | 2.27 | 950 | 0.47 | 5.5 |
| 62* | " | " | " | 6 | 3.39 | 320 | 0.39 | 16.1 |
| 63 | 0.10 | 0.75 | 0.15 | 0.5 | 0.64 | 850 | 0.14 | 4.5 |
| 64 | 0.09 | 0.01 | 0.90 | 0.1 | 2.07 | 740 | 0.14 | 5.3 |
| 65 | " | " | " | 5 | 2.35 | 620 | 0.12 | 5.6 |
| 66 | 0.20 | 0.48 | 0.32 | 0.5 | 0.49 | 500 | 0.43 | 4.2 |
| 67 | 0.20 | 0.38 | 0.47 | 0.1 | 3.29 | 520 | 0.52 | 5.0 |

Table 2-continued

| Example No. | Base Material (Molar ratio) x | y | z | Additive CoO (wt%) | D(%) | $Q_M$ | kp | R-t(%) |
|---|---|---|---|---|---|---|---|---|
| 68 | " | " | " | 0.5 | 0.49 | 1630 | 0.46 | 4.1 |
| 69 | " | " | " | 5 | 3.46 | 980 | 0.41 | 5.5 |
| 70 | 0.20 | 0.10 | 0.70 | 0.5 | 0.66 | 830 | 0.21 | 4.6 |
| 71 | 0.25 | 0.745 | 0.005 | 0.1 | 0.60 | 540 | 0.13 | 5.4 |
| 72 | " | " | " | 5 | 2.77 | 490 | 0.11 | 5.7 |
| 73 | 0.30 | 0.48 | 0.22 | 0.5 | 0.54 | 1220 | 0.30 | 4.2 |
| 74 | 0.30 | 0.33 | 0.37 | 1 | 0.61 | 1510 | 0.37 | 4.3 |
| 75 | " | " | " | 5 | 3.29 | 480 | 0.34 | 5.7 |
| 76 | 0.30 | 0.23 | 0.47 | 0.5 | 0.67 | 980 | 0.29 | 4.3 |
| 77 | 0.30 | 0.01 | 0.69 | 0.5 | 0.91 | 770 | 0.14 | 4.5 |
| 78 | 0.50 | 0.495 | 0.005 | 0.1 | 3.65 | 480 | 0.14 | 5.3 |
| 79 | " | " | " | 5 | 4.52 | 490 | 0.12 | 5.6 |
| 80 | 0.50 | 0.23 | 0.27 | 0.5 | 0.67 | 870 | 0.19 | 4.4 |
| 81 | 0.50 | 0.01 | 0.49 | 0.1 | 3.96 | 510 | 0.14 | 5.4 |
| 82 | " | " | " | 5 | 4.68 | 480 | 0.11 | 5.8 |

Table 3

| Example No. | Base Material (Molar ratio) x | y | z | Additive $Cr_2O_3$ (Wt %) | D (%) | $Q_M$ | kp | R-t(%) |
|---|---|---|---|---|---|---|---|---|
| 83 | 0.01 | 0.75 | 0.24 | 0.1 | 2.15 | 490 | 0.13 | 4.8 |
| 84 | " | " | " | 5 | 2.47 | 510 | 0.10 | 4.5 |
| 85 | 0.01 | 0.47 | 0.52 | 0.5 | 0.76 | 580 | 0.59 | 4.6 |
| 86 | " | " | " | 2 | 1.05 | 720 | 0.50 | 4.2 |
| 87 | 0.01 | 0.09 | 0.90 | 0.1 | 2.61 | 610 | 0.18 | 5.1 |
| 88 | " | " | " | 5 | 4.30 | 540 | 0.16 | 5.3 |
| 89 | 0.05 | 0.55 | 0.40 | 0.5 | 0.82 | 530 | 0.46 | 4.2 |
| 90 | 0.05 | 0.43 | 0.52 | 0.1 | 0.76 | 490 | 0.66 | 4.6 |
| 91 | " | " | " | 0.5 | 0.59 | 1580 | 0.54 | 3.9 |
| 93 | " | " | " | 5 | 2.40 | 910 | 0.43 | 5.1 |
| 94* | " | " | " | 6 | 3.52 | 290 | 0.32 | 16.0 |
| 95 | 0.10 | 0.75 | 0.15 | 0.5 | 0.71 | 830 | 0.13 | 4.3 |
| 96 | 0.09 | 0.01 | 0.90 | 0.1 | 2.16 | 710 | 0.13 | 5.2 |
| 97 | " | " | " | 5 | 2.41 | 580 | 0.11 | 5.3 |
| 98 | 0.20 | 0.48 | 0.32 | 0.5 | 0.54 | 510 | 0.42 | 4.0 |
| 99 | 0.20 | 0.38 | 0.47 | 0.1 | 3.34 | 530 | 0.51 | 4.7 |
| 100 | " | " | " | 0.5 | 0.56 | 1610 | 0.44 | 4.0 |
| 101 | " | " | " | 5 | 3.38 | 750 | 0.40 | 5.2 |
| 102 | 0.20 | 0.10 | 0.70 | 0.5 | 0.72 | 800 | 0.20 | 4.4 |
| 103 | 0.25 | 0.745 | 0.005 | 0.1 | 0.71 | 520 | 0.12 | 5.1 |
| 104 | " | " | " | 5 | 2.82 | 500 | 0.10 | 5.3 |
| 105 | 0.30 | 0.48 | 0.22 | 0.5 | 0.60 | 1160 | 0.28 | 4.0 |
| 106 | 0.30 | 0.33 | 0.37 | 1 | 0.67 | 1340 | 0.36 | 4.1 |
| 107 | " | " | " | 5 | 3.32 | 490 | 0.34 | 5.4 |
| 108 | 0.30 | 0.23 | 0.47 | 0.5 | 0.72 | 920 | 0.27 | 4.1 |
| 109 | 0.30 | 0.01 | 0.69 | 0.5 | 1.01 | 730 | 0.13 | 4.2 |
| 110 | 0.50 | 0.495 | 0.005 | 0.1 | 3.78 | 490 | 0.13 | 5.1 |
| 111 | " | " | " | 5 | 4.64 | 500 | 0.11 | 5.3 |
| 112 | 0.50 | 0.23 | 0.27 | 0.5 | 0.75 | 840 | 0.18 | 4.2 |
| 113 | 0.50 | 0.01 | 0.49 | 0.1 | 4.13 | 500 | 0.13 | 5.1 |
| 114 | " | " | " | 5 | 4.84 | 490 | 0.10 | 5.4 |

Table 4

| Example No. | Base Material (Molar ratio) x | y | z | Additive $Fe_2O_3$ (Wt %) | D(%) | $Q_M$ | kp | R-t(%) |
|---|---|---|---|---|---|---|---|---|
| 115 | 0.01 | 0.75 | 0.24 | 0.1 | 2.24 | 480 | 0.14 | 5.2 |
| 116 | " | " | " | 5 | 2.49 | 500 | 0.11 | 5.0 |
| 117 | 0.01 | 0.47 | 0.52 | 0.5 | 0.84 | 560 | 0.62 | 5.0 |
| 118 | " | " | " | 2 | 1.08 | 710 | 0.53 | 4.7 |
| 119 | 0.01 | 0.09 | 0.90 | 0.1 | 2.73 | 590 | 0.19 | 5.4 |
| 120 | " | " | " | 5 | 4.28 | 520 | 0.17 | 5.8 |
| 121 | 0.05 | 0.55 | 0.40 | 0.5 | 0.88 | 540 | 0.48 | 4.8 |
| 122 | 0.05 | 0.43 | 0.52 | 0.1 | 0.82 | 480 | 0.67 | 5.1 |
| 123 | " | " | " | 0.5 | 0.64 | 1520 | 0.57 | 4.2 |
| 124 | " | " | " | 3 | 0.75 | 1730 | 0.51 | 4.6 |
| 125 | " | " | " | 5 | 2.47 | 860 | 0.48 | 6.0 |
| 126* | " | " | " | 6 | 3.61 | 270 | 0.40 | 16.2 |
| 127 | 0.10 | 0.75 | 0.15 | 0.5 | 0.74 | 810 | 0.15 | 4.7 |
| 128 | 0.09 | 0.01 | 0.90 | 0.1 | 2.21 | 650 | 0.15 | 5.5 |
| 129 | " | " | " | 5 | 2.38 | 540 | 0.12 | 6.0 |

Table 4-continued

| Example No. | Base Material (Molar ratio) x | y | z | Additive $Fe_2O_3$ (Wt %) | D(%) | $Q_M$ | kp | R-t(%) |
|---|---|---|---|---|---|---|---|---|
| 130 | 0.20 | 0.48 | 0.32 | 0.5 | 0.58 | 520 | 0.45 | 4.4 |
| 131 | 0.20 | 0.38 | 0.47 | 0.1 | 3.38 | 510 | 0.53 | 5.1 |
| 132 | " | " | " | 0.5 | 0.59 | 1580 | 0.48 | 4.2 |
| 133 | " | " | " | 5 | 3.38 | 738 | 0.42 | 5.6 |
| 134 | 0.20 | 0.10 | 0.70 | 0.5 | 0.78 | 780 | 0.23 | 4.9 |
| 135 | 0.25 | 0.745 | 0.005 | 0.1 | 0.76 | 510 | 0.14 | 5.5 |
| 136 | " | " | " | 5 | 2.78 | 490 | 0.11 | 6.1 |
| 137 | 0.30 | 0.48 | 0.22 | 0.5 | 0.65 | 1130 | 0.31 | 4.5 |
| 138 | 0.30 | 0.33 | 0.37 | 1 | 0.72 | 1320 | 0.38 | 4.6 |
| 139 | " | " | " | 5 | 3.28 | 510 | 0.35 | 5.7 |
| 140 | 0.30 | 0.23 | 0.47 | 0.5 | 0.76 | 870 | 0.29 | 4.5 |
| 141 | 0.30 | 0.01 | 0.69 | 0.5 | 1.08 | 720 | 0.15 | 4.6 |
| 142 | 0.50 | 0.495 | 0.005 | 0.1 | 3.85 | 480 | 0.14 | 5.7 |
| 143 | " | " | " | 5 | 4.67 | 500 | 0.12 | 5.9 |
| 144 | 0.50 | 0.23 | 0.27 | 0.5 | 0.81 | 820 | 0.21 | 4.7 |
| 145 | 0.50 | 0.01 | 0.49 | 0.1 | 4.21 | 490 | 0.14 | 5.6 |
| 146 | " | " | " | 5 | 4.88 | 480 | 0.12 | 6.0 |

Table 5

| Example No. | Base Material (Molar ratio) x | y | z | Additive NiO (Wt %) | D(%) | $Q_M$ | kp | R-t(%) |
|---|---|---|---|---|---|---|---|---|
| 147 | 0.01 | 0.75 | 0.24 | 0.1 | 2.31 | 480 | 0.14 | 5.1 |
| 148 | " | " | " | 5 | 2.50 | 510 | 0.12 | 4.8 |
| 149 | 0.01 | 0.47 | 0.52 | 0.5 | 0.95 | 550 | 0.63 | 4.9 |
| 150 | " | " | " | 2 | 1.12 | 690 | 0.53 | 4.7 |
| 151 | 0.01 | 0.09 | 0.90 | 0.1 | 2.85 | 570 | 0.19 | 5.3 |
| 152 | " | " | " | 5 | 4.31 | 510 | 0.16 | 5.4 |
| 153 | 0.05 | 0.55 | 0.40 | 0.5 | 0.95 | 530 | 0.49 | 4.4 |
| 154 | 0.05 | 0.43 | 0.52 | 0.1 | 1.46 | 480 | 0.67 | 5.1 |
| 155 | " | " | " | 0.5 | 0.83 | 1490 | 0.58 | 4.3 |
| 156 | " | " | " | 3 | 1.37 | 1680 | 0.52 | 4.5 |
| 157 | " | " | " | 5 | 2.64 | 790 | 0.48 | 5.7 |
| 158* | " | " | " | 6 | 3.80 | 250 | 0.39 | 16.3 |
| 159 | 0.10 | 0.75 | 0.15 | 0.5 | 0.87 | 800 | 0.15 | 4.7 |
| 160 | 0.09 | 0.01 | 0.90 | 0.1 | 2.27 | 590 | 0.15 | 5.4 |
| 161 | " | " | " | 5 | 2.39 | 550 | 0.12 | 5.6 |
| 162 | 0.20 | 0.48 | 0.32 | 0.5 | 0.72 | 500 | 0.46 | 4.4 |
| 163 | 0.20 | 0.38 | 0.47 | 0.1 | 3.27 | 490 | 0.52 | 5.1 |
| 164 | " | " | " | 0.5 | 0.73 | 1520 | 0.50 | 4.3 |
| 165 | " | " | " | 5 | 3.38 | 710 | 0.43 | 5.7 |
| 166 | 0.20 | 0.10 | 0.70 | 0.5 | 0.86 | 730 | 0.23 | 4.7 |
| 167 | 0.25 | 0.745 | 0.005 | 0.1 | 1.22 | 480 | 0.14 | 5.6 |
| 168 | " | " | " | 5 | 2.74 | 500 | 0.11 | 5.9 |
| 169 | 0.30 | 0.48 | 0.22 | 0.5 | 0.78 | 1080 | 0.31 | 4.3 |
| 170 | 0.30 | 0.33 | 0.37 | 1 | 0.86 | 1190 | 0.37 | 4.6 |
| 171 | " | " | " | 5 | 3.23 | 500 | 0.34 | 5.9 |
| 172 | 0.30 | 0.23 | 0.47 | 0.5 | 0.89 | 790 | 0.29 | 4.5 |
| 173 | 0.30 | 0.01 | 0.69 | 0.5 | 1.16 | 680 | 0.15 | 4.7 |
| 174 | 0.50 | 0.495 | 0.005 | 0.1 | 3.78 | 490 | 0.15 | 5.4 |
| 175 | " | " | " | 5 | 4.70 | 510 | 0.12 | 5.7 |
| 176 | 0.50 | 0.23 | 0.27 | 0.5 | 0.93 | 780 | 0.22 | 4.6 |
| 177 | 0.50 | 0.01 | 0.49 | 0.1 | 4.28 | 480 | 0.15 | 5.7 |
| 178 | " | " | " | 5 | 4.79 | 490 | 0.12 | 6.0 |

What is claimed is:

1. A piezoelectric ceramic composition consisting essentially of a base ternary solid solution selected from those defined by and included within area A B C D E F of the diagram of FIG. 2 and further containing CoO in an amount ranging from 0.1 to 5 weight percent.

2. A piezoelectric ceramic composition consisting essentially of a base ternary solid solution selected from those defined by and included within area A B C D E F of the diagram of FIG. 2 and further containing $Cr_2O_3$ in an amount ranging from 0.1 to 5 weight percent.

3. A piezoelectric ceramic composition consisting essentially of a base ternary solid solution selected from those defined by and included within area A B C D E F of the diagram of FIG. 2 and further containing $Fe_2O_3$ in an amount ranging from 0.1 to 5 weight percent.

4. A piezoelectric ceramic composition consisting essentially of a base ternary solid solution selected from those defined by and included within area A B C D E F of the diagram of FIG. 2 and further containing NiO in an amount ranging from 0.1 to 0.5 weight percent.

* * * * *